(12) United States Patent
Rueb

(10) Patent No.: US 10,935,502 B2
(45) Date of Patent: Mar. 2, 2021

(54) DIRECTED ENERGY AND SENSING FOR DETECTION OF INCONSISTENCIES IN LAMINATES

(71) Applicant: Virtek Vision International ULC, Waterloo (CA)

(72) Inventor: Kurt D. Rueb, Kitchener (CA)

(73) Assignee: VIRTEK VISION INTERNATIONAL, ULC, Waterloo (CA)

( * ) Notice: Subject to any disclaimer, the term of this patent is extended or adjusted under 35 U.S.C. 154(b) by 149 days.

(21) Appl. No.: 16/379,105

(22) Filed: Apr. 9, 2019

(65) Prior Publication Data

US 2019/0310204 A1 Oct. 10, 2019

Related U.S. Application Data

(60) Provisional application No. 62/655,587, filed on Apr. 10, 2018.

(51) Int. Cl.
*G01N 21/88* (2006.01)
*H01L 31/0296* (2006.01)

(52) U.S. Cl.
CPC .... *G01N 21/8806* (2013.01); *H01L 31/02966* (2013.01)

(58) Field of Classification Search
CPC .......... H01L 31/02966; G01N 21/8422; G01N 21/8806; G01N 21/88; G01N 2201/08
See application file for complete search history.

(56) References Cited

U.S. PATENT DOCUMENTS

| | | | | |
|---|---|---|---|---|
| 5,680,207 A | * | 10/1997 | Hagiwara | G01N 21/88 356/237.3 |
| 6,532,066 B1 | * | 3/2003 | Filev | G01N 21/8422 348/92 |
| 2004/0262529 A1 | * | 12/2004 | Yoshida | G01N 21/8806 250/372 |
| 2017/0248406 A1 | * | 8/2017 | Shadmehri | G01N 21/1717 |

* cited by examiner

*Primary Examiner* — David P Porta
*Assistant Examiner* — Fani Boosalis
(74) *Attorney, Agent, or Firm* — Miller Canfield Paddock and Stone PLC; Gregory D. Degrazia

(57) ABSTRACT

A method for detecting inconsistencies in an assembly using an energy source and an imaging device is disclosed. An energy source directs energy through first scanning mirrors toward a surface of the laminated composite assembly raising an energy level of an inspection area. An imaging device directs a view through second scanning mirrors toward the inspection area and the imaging device detects a rate of change in energy at the surface of the laminated composite. Movement of the first scanning mirrors is synchronized with movement of the second scanning mirrors for directing a view of the imaging device to the inspection area after the energy level of the area of the surface has been raised. The imaging device detects dissipation of energy at the area of the surface being inspected and identifies inconsistencies associated defects in the assembly.

15 Claims, 2 Drawing Sheets

DIRECTED ENERGY AND SENSING FOR DETECTION OF INCONSISTENCIES IN LAMINATES

PRIOR APPLICATIONS

The present application claims priority to U.S. Provisional Patent Application No. 62/655,587, filed on Apr. 10, 2018, the contents of which are incorporated herein by reference.

TECHNICAL FIELD

The present application relates generally toward an improved method of detecting inconsistencies or foreign objects causing defects during an assembly process. More specifically, the present invention relates toward detecting inconsistencies or foreign objects by increasing an energy level of a surface and sensing inconsistent dissipation of same.

BACKGROUND

During certain manufacturing processes, there is a possibility of foreign material or other defects being entrapped in an assembly, rending the subsequent part unusable. For example, when constructing composite parts, many layers or plys of composite material are sequentially placed on a mandrel or work surface to form, for example light weight aerospace components. Once a predetermined number of layers of ply have been placed, epoxy or other resin impregnating the fibrous materials forming each of the layers is cured. If foreign materials, voids, or other defects become entrapped between layers, proper interlayer bonding when curing the composite is can be defective. Such defects focus stress within the component, and can result in catastrophic failure of the component.

After the composite forming the component is cured, the component is typically tested for validation that the component is defect free, or at least within necessary quality standards. Thermal or ultrasonic testing is performed for identifying, if a defect is outside required quality standards that would impair structural integrity of the component, but have only been performed after the polymers forming the component have been cured. When these defects have been identified, the cured component is often scrapped at great expense and loss of manufacturing efficiency. Alternatively, extensive repairs are performed at additional cost and loss of manufacturing efficiency.

To avoid these manufacturing setbacks, it is desirable to validate the composite component prior to curing the resin. However, accurate detection of these defects prior to curing has proven elusive. To date, validation has only been performed after curing and with a limited amount of success.

One example of post curing validation of the composite has been with the use of thermal imaging. Thermal imaging requires raising the temperature of the already cured composite component. If the surface of the cured component is heated a thermal monitor attempts to detect inconsistencies in the dissipation of heat. Efforts have been made to improve this approach be more precisely heating the cured components and capturing a heat profile. However, these systems require placing a heat source and thermal camera in very close proximity to the surface of the cured composite. This approach requires either manual positioning of the heat source and thermal camera or the use of a robot arm or gantry, particularly when inspecting large areas, such as, for example, a commercial airplane wing or fusilage. Due to the time required for heat transfer to occur, this process of measurement take several seconds, which causes unacceptable delays in manufacturing.

While this approach does identify defective components, the approach has still only proven sufficiently accurate on fully cured components. Therefore, the component must be either scrapped or subject to extensive repair. Therefore, to avoid this dilemma, it would be useful to develop an inspection process and system that is performed prior to curing the resin and permanently adhering the layers of ply.

SUMMARY

A method and assembly for detecting inconsistencies in an assembly using an energy source and an imaging device is disclosed. An energy source directs energy through first scanning mirrors toward a surface of the assembly for raising an energy level of an area to be inspected. An imaging device directs a view of the imaging device through second scanning mirrors toward the area to be inspected and the imaging device detects a rate of change in energy at the surface of the laminated composite. The movement of the first scanning mirrors is correlated with the movement of the second scanning mirrors for directing a view of the imaging device to the area of the surface being inspected after the energy level of the area of the surface being inspected has been raised. The imaging device detects dissipation of energy at the area of the surface being inspected and identifies inconsistencies associated defects in the assembly.

The inspection system of the present invention is capable of inspecting, for example, an uncured composite component from great distances due, in part, to the rapid movement of the first scanning mirrors and the second scanning mirrors in a correlated or synchronized manner. The first scanning mirrors and the second scanning mirror scan sequentially across large areas while the source of energy and the imaging device remain immobile. Because the first mirrors and second mirrors move in rapid succession, very precise inconsistencies in energy dissipation are detected, even on uncured layers of ply. In this manner, defects are rapidly detected at substantial distances reducing inspection time and relieving an operator of additional step in the manufacturing process.

BRIEF DESCRIPTION OF THE DRAWINGS

Other advantages of the present invention will be readily appreciated as the same becomes better understood by reference to the following detailed description, when considered in connection with the accompanying drawing, wherein.

DETAILED DESCRIPTION

Figure 1:
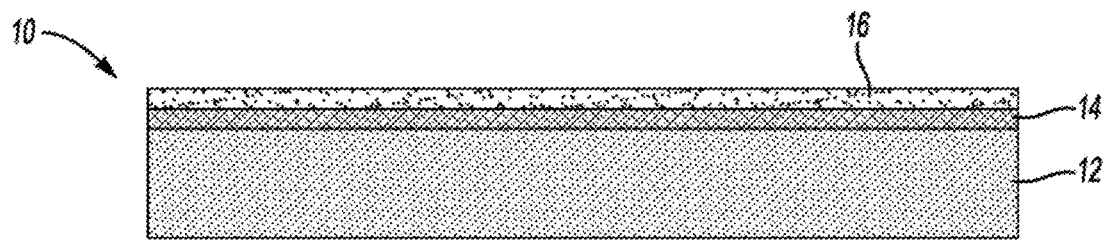
FIG. 1 shows an exemplary cross-sectional view of a properly constructed composite component.

During manufacturing processes, such as, for example, manufacturing a laminate composite for aerospace wings and the like, serious defects are known to occur when objects become entrapped between layers. Referring to FIG. 1, a section of properly constructed composite assembly is generally shown at 10. A mandrel or assembly tool 12 serves as a base for receiving a first ply layer 14. The first ply layer 14 is formed from a fiber reinforced tape or section cut from a fiber reinforced sheet of composite material (not shown) into a predetermined configuration suitable for the object being formed. The use of "composite material" and "ply" throughout the application is merely exemplary and not limiting in any way. The invention of the present application may be used to identify inconsistencies on a variety of surfaces, including, but not limited to, welds surfaces, coated surfaces, metals and any other surface or substrate upon which non-destructive determination of inconsistencies by way of evaluating energy dissipation may be useful. The composite material is a thermoset or thermoplastic polymer impregnated with filler such as, for example, carbon fiber, fiber glass or the like to provide additional strength to the composite. After the relevant portion of the assembly tool 12 is covered with the first ply layer 14, a second ply layer 16 is laid over the first ply layer 14.

As is known to those of skill in the art, after the second ply layer 16 is laid over the first ply layer 14, additional ply layers (not shown) are laid over the second ply layer 16 to obtain desired composite thickness. Once a sufficient number of layers have been put in place, the composite material is cured causing interlayer adhesion through crosslinking or other chemical interaction preventing the layers from being separated. As will become more evident herein below, heat or energy dissipation of the properly constructed, defect free composite is expected to be uniform.

Figure 2:
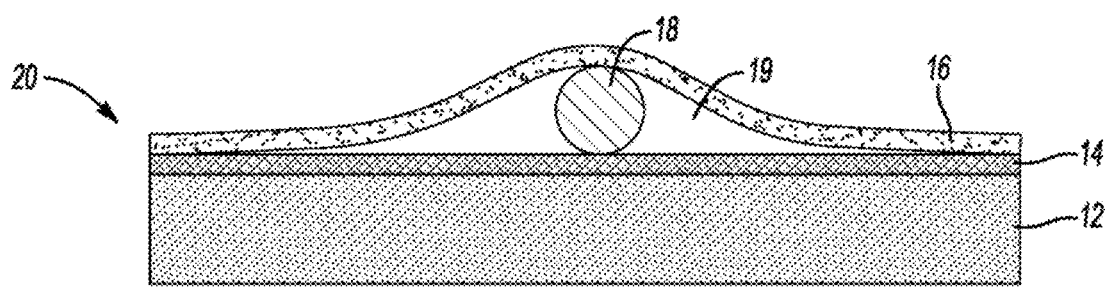
FIG. 2 shows an exemplary cross-sectional view of foreign material trapped between two layers of ply.

FIG. 2 shows a defective composite assembly generally at 20. In this example, the first ply layer 14 is laid over the assembly tool 12. The second ply layer 14 is laid over the first ply layer 16, but foreign material 18 has become entrapped between the first ply layer 14 and the second ply layer 16. While the foreign material 18 is generically represented, examples of foreign material include, but are not limited to, packaging, backing paper, clothing, industrial contamination, and even air bubbles or voids 19. Problems associated with entrapped foreign material 18 have been explained above and will not be further explained herein.

Figure 3:
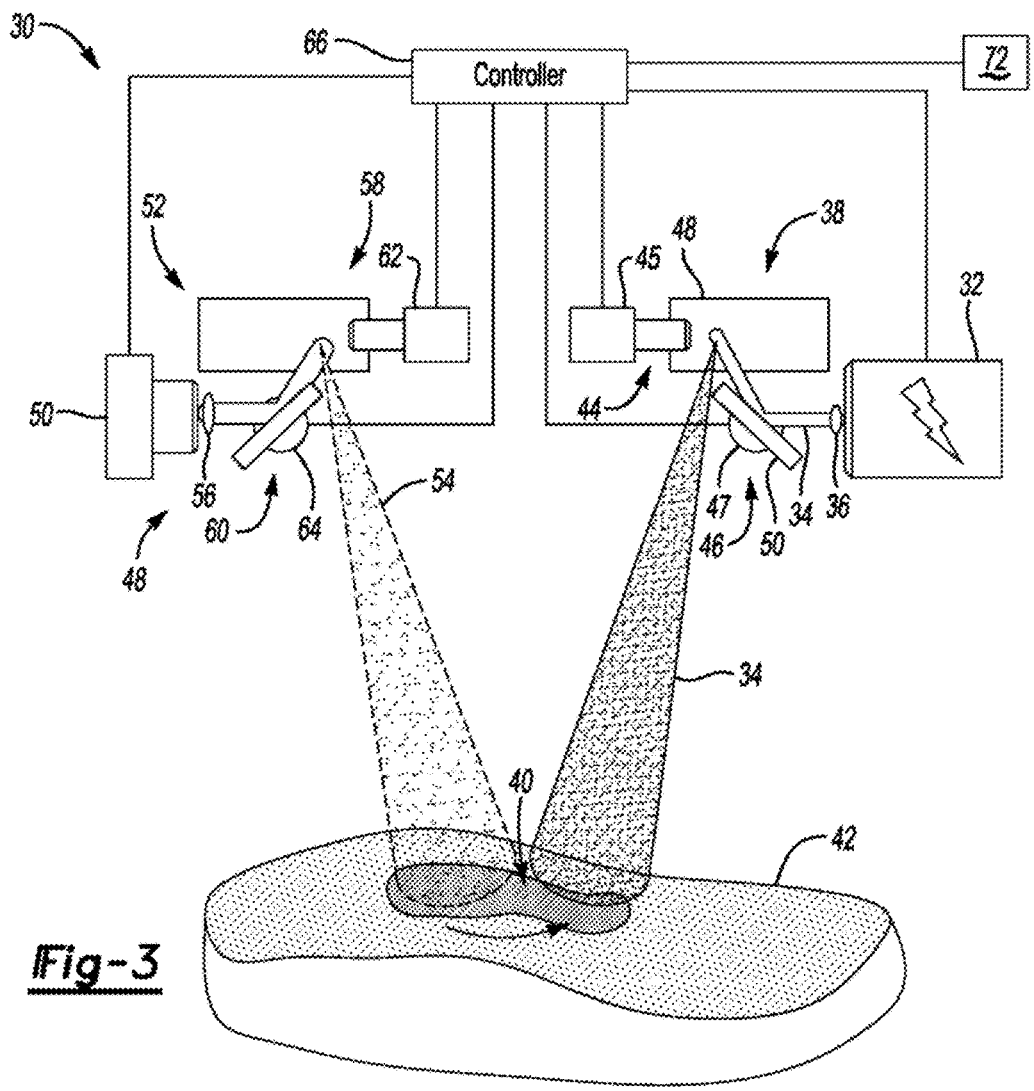
FIG. 3 shows a schematic of the detection system of the present invention.

Referring now to FIG. 3, an inspection system of the present invention is generally shown at 30. The inspection system includes an energy source 32 that generates an energy beam 34. The energy beam 34 is optionally focused through a lens 36. The energy beam is redirected toward first scanning mirrors 38 toward a predetermined inspection area 40 upon an assembly surface 42. The first scanning mirrors 38 include a first scanning assembly 44 and a second scanning assembly 46. The first scanning assembly 44 and the second scanning assembly 46 respectively include a servo first reflector 48 and a servo second reflector 50, cooperatively and rapidly redirecting the energy beam 34 along the inspection area 40 to raise an energy level of the inspection area 40. The first scanning assembly 44 is driven by a first servo motor 45 and the second scanning assembly 46 is driven by a second servo motor 47. The energy beam 34 is generated by any of a halogen lamp, a xenon flash, and a coherent light source. When one or a combination of these energy sources 32 are selected, a temperature of the inspection area 40 is raised from ambient to a temperature slightly higher than ambient. Other energy sources 32 are within the scope of this invention that include, but are not limited to, those that excite the molecules of the polymer above a ground state.

When an energy source 32 is selected that raises the temperature of the composite assembly 10, 20, the increase in temperature is only about 1° C. Uniform layering of the properly constructed assembly 10 results in uniform heat (energy) absorption and dissipation. Foreign material 18 (or air pocket) disposed between the first ply layer 14 and the second ply layer 16 result in uneven heat (energy) absorption and dissipation.

An imaging device 48 is provided that is capable of detecting uneven absorption and dissipation of energy from the inspection area 40. The imaging device 48, in one embodiment is a camera 50 having thermal imaging capabilities for detecting small amounts of heat variation on a surface such as, but not limited to a long wave infrared camera including a cooled Mercury Cadmium Telluride array. Alternative imaging devices 48 capable of detecting variation in energy on a surface of a composite, including, but not limited to, detecting molecular excitation are also within the scope of this invention.

The imaging device 48 includes second scanning mirrors 52 for redirecting a view 54 of the camera 50. The view 54 of the camera 50 is optionally focused through a camera lens 56. The view 54 is redirected by the second scanning mirrors 52 toward the predetermined inspection area 40 upon the assembly surface 42. The second scanning mirrors 52 include a third scanning assembly 58 and a fourth scanning assembly 60. The third scanning assembly 58 and the fourth scanning assembly 60 respectively include a servo driven third reflector 62 and a servo driven fourth reflector 64, cooperatively and rapidly redirecting the camera view 54 along the inspection area 40 to detect the energy level of the inspection area 40.

The first scanning assembly 44, the second scanning assembly 46, the third scanning assembly 58 and the fourth scanning assembly 60 are cooperatively driven by a controller 66. The controller 66 coordinates the scanning assemblies 44, 46, 58, 60 so that the camera view 54 rapidly follows movement of the energy beam 34. The increase in energy level of the inspection area 40 is of a deminimis amount to avoid adverse physical alteration of the composite dissipates rapidly. Therefore, the camera view 54 closely follows a path 68 of the energy beam.

The first scanning mirrors 38 and the second scanning mirrors 52 make up a galvanometer system. In this embodiment, the galvanometer assembly includes two scanning mirrors 38, 52 that cooperatively synchronize the view 54 of the imaging device 50 with the location of transmission of the energy beam. 34 from the energy source 32. However, it should be understood that a rapidly moving galvanometer assembly including a single scanning mirror could also synchronize the view 54 of the imaging device 50 with the location of transmission of the energy beam 34 from the energy source 32. In this embodiment, the scanning mirror would simultaneously redirect one of the view 54 of the imaging device 50 and the energy beam 34 away from the surface being inspected while directing the other of the view 54 and energy beam 34 toward the surface in synchronized succession.

Different approaches may be used to synchronize the path of energy beam 34 across the surface with the path of view 54 of the imaging device 50. For example, a beam splitter (not shown) would reflect shorter, higher wavelengths of the energy beam 34 through the scanning galvanometer to the surface, but allow longer wavelengths associated with the surface energy to pass through to the camera. Additional accuracy is obtainable by rapidly activating and deactivating the energy beam 34 in synch with the view 54 of the imaging device so that the camera 50 to prevent reflected energy from the energy beam 34 interfering with accurate imaging of the surface 42 being viewed by the imaging device 50.

Multiples of the inspection area 40 are optionally exposed to an increase in energy and then scanned by the camera 50 so that sequenced images can be interleaved. In this manner, simultaneous responses to energy pulses are acquired. The combination of multiple individual image segments based upon accurate positioning of the camera view 54 provides a high resolution thermographic image enabling the detection of even very small defects existing in the assembly 20 through identifying even minute deviations in energy dissipation.

Further enhancements are achieved when the inspection system 30 is integrated with a laser projector (not shown) used to locate the assembly surface 42 and project a laser template directing an operator where to place a piece of ply, if the inspection system 30 is registered to a reference frame of the assembly surface 42 and integrated into the assembly process, the imaging sequence by the inspection system 30 can be restricted to only the area of the most recent placement of a piece of ply, further increasing the efficiency of the inspection.

For example, the laser projection system disclosed in U.S. Pat. No. 9,200,899, the contents of which are included herein by reference, discloses a laser projection assembly using a photogrammetry assembly for locating a workpiece or layup for projecting a laser template. The laser template directs a location of placement of a layer of composite material that is correlated to the inspection area 40 identified in FIG. 3. Therefore, the photogrammetry or equivalent locating system disclosed in the U.S. Pat. No. 9,200,899 also directs the first and second scanning mirrors 38, 52 where to direct the energy beam 34 from the energy source 32 and the camera view 54 providing an efficient and rapid response time.

The controller 66 coordinates movement of the laser projector disclosed in the U.S. Pat. No. 9,200,899 with the first and second scanning mirrors 38, 52 of the present application. In one embodiment, the first and second scanning mirrors 38, 52 scan the area of interest 40 prior to the resin impregnating the carbon fiber being cured as is set forth above. This allows an operator to take necessary corrective action without having to subject the laminated composite to a repair procedure by merely removing the earlier placed ply to correct the defect. It should, therefore, be understood that the temperature of the inspection area 40 of the composite assembly 10 is not raised to the curing temperature of the resin to avoid unwanted polymer reactions.

Figure 4:
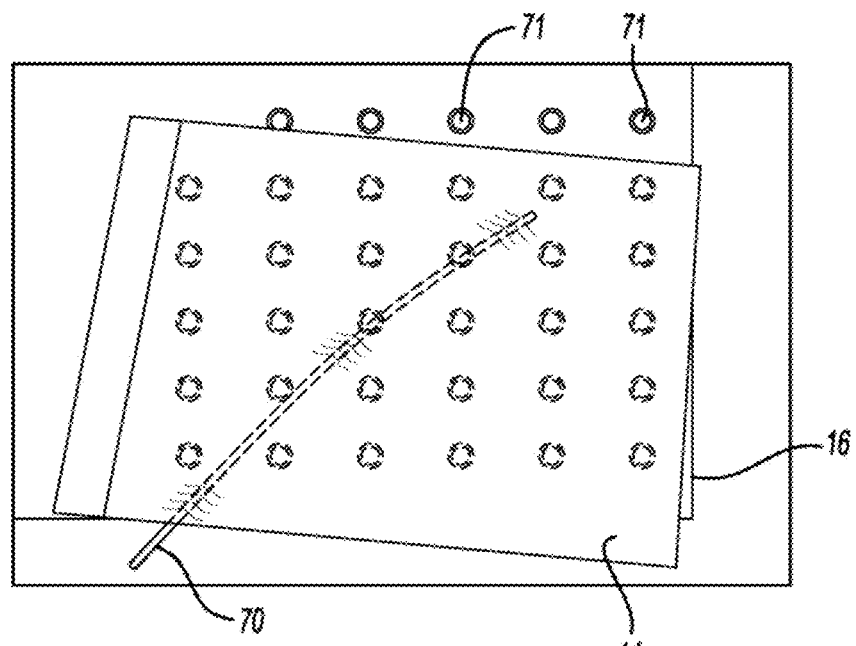
FIG. 4 shows a top view of a layer of ply having foreign material trapped there beneath.
Figure 5:
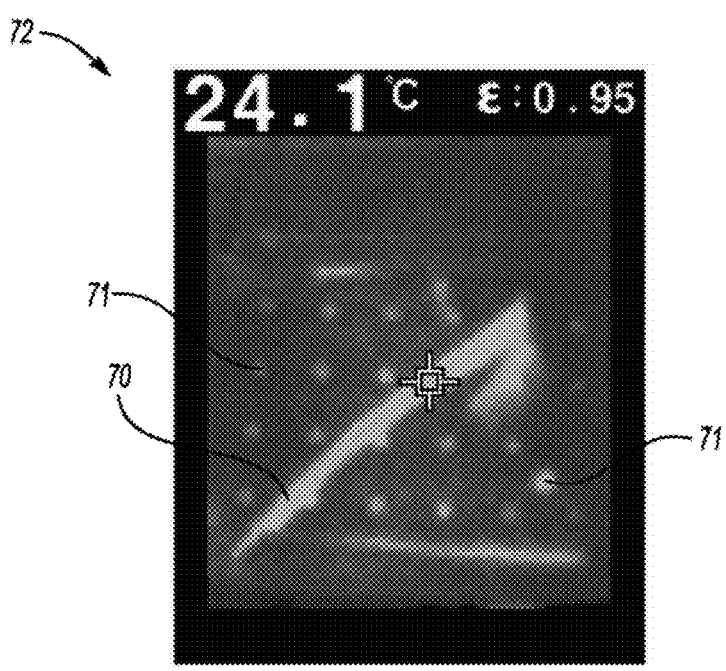
FIG. 5 shows a top view of an image of the layer of ply generated by an imaging device of the present invention.

Referring now to FIGS. 4 and 5, foreign material, such as, for example a plastic tie 70 is placed between the uncured first ply layer 14 and second ply layer 16. It is readily apparent from FIG. 4 that the flat black, opaque nature of the second ply layer 16 makes it nearly impossible for an operator to detect the plastic tie 70, even as apparent as it may seem. In addition, a grid of voids 71 are formed in the first ply layer 14 to represent air pockets formed between the two layers 14, 16. FIG. 5 shows an image of the first ply 14 after being subjected to the energy beam 34 raising the energy level of the composite. The camera generates an image on a monitor 72 indicating a location of the foreign material 70 (18) to an operator based upon different levels of energy dissipation due to the foreign material 18 and even merely a void 71 resulting from an air bubble disposed between the first ply layer 14 and the second ply layer 16. The monitor 72 includes a template, a computer monitor, smart device and even goggles. The monitor view is optionally correlated to a location of the inspection area 40 and generates an augmented view of the inspection area in a manner similar to that disclosed in co-pending U.S. patent application Ser. No. 15/058,867, the contents of which are included herein by reference, to further assist an operator with locating defects.

In one embodiment, the first scanning mirrors 38 and the second scanning mirrors 52 are driven by a galvanometer scanning system, such as the 62xxH series from Cambridge Technologies. The reflectors 48, 50, 62, 64 each include a 350 nm to 12 µm broadband mirror coating. In addition, the imaging device 48 is an uncooled micro bolometer detector array, such as the FUR A325sc infrared camera with a 76 mm focal length camera lens 56 providing a 6×4.5 degree field of view through the second scanning mirror 52.

The invention has been described herein in an illustrative manner, and it is to be understood that the terminology which has been used is intended to be in the nature of words of description rather than of limitation. Obviously, many modifications and variations of the invention are possible in light of the above teachings. The invention can be practiced otherwise than as specifically described within the scope of the appendant claims.

What is claimed is:

1. A method for detecting inconsistencies in an assembly using an energy source and an imaging device, comprising the steps of:
   providing an energy source and directing energy from the energy source through first scanning mirrors toward a surface of the laminated composite assembly to be inspected thereby raising an energy level of the area to be inspected;
   providing a imaging device and directing a view of the imaging device through second scanning mirrors toward the area to be inspected and the imaging device detecting a rate of change in energy at the surface of the laminated composite; and
   synchronizing movement of the first scanning mirrors with movement of the second scanning mirrors for directing a view of the imaging device to the area of the surface being inspected after the energy level of the area of the surface being inspected has been raised; and
   detecting variations in dissipation of energy level at the area of the surface being inspected thereby identifying inconsistencies associated defects in the assembly.

2. The method set forth in claim 1, wherein the step of providing an energy source is further defined as providing a heat energy source thereby raising a temperature of the assembly in the area to be inspected prior to directing the view of the imaging device to the area to be inspected.

3. The method set forth in claim 2, further including a step of redirecting the energy source away from the area to a second area to be inspected to be inspected after providing a desired energy exposure.

4. The method set forth in claim 3, further including a step of directing the imaging device to the second area to be inspected following the step of raising the energy level of the second area to be inspected.

5. The method set forth in claim 3, wherein the step of providing an imaging device is further defined by providing a long wave infrared camera including a cooled Mercury Cadmium Telluride array.

6. The method set forth in claim 1, wherein the step of providing an energy source is further defined by providing a heat energy source.

7. The method set forth in claim 6, wherein the step of providing a heat energy source is further defined by providing one of a halogen lamp, a xenon flash, and a coherent light source.

8. The method set forth in claim 1, further including a step of sequentially redirecting energy from the energy source to sequential areas to be inspected.

9. The method set forth in claim 1, further including a step of said imaging device repeatedly scanning sequential areas to be inspected for constructing a time sequenced energy dissipation response.

10. The method set forth in claim 9, wherein the step of constructing time sequenced energy dissipation is further defined detecting a location of inconsistencies associated defects through inconsistent reduction in energy conductivity.

11. The method of claim 1, further including the step of restricting the area to be inspected to an area of a specified placement of a ply of composite material.

12. The method of claim 11, further including the step of signaling the first scanning mirrors of the energy source and the second scanning mirrors of the imaging device a location of an area to be inspected as defined by a laser template projected by a laser projector.

13. A method of detecting inconsistencies in an assembly using an energy source and an imaging device, comprising the steps of:

providing an energy source for directing a beam of energy toward a surface to be inspected;

providing an imaging device including a view of the surface to be inspected and being capable of detecting variation of energy upon the surface to be inspected;

providing a galvanometer system for synchronizing a location of transmission of the energy beam upon the surface with a view of the surface by the imaging device;

using the energy source to raise an energy level of the surface;

using the imaging device to detect inconsistencies in the assembly based upon uneven dissipation of energy on the surface; and using the galvanometer system for synchronizing transmission of the energy beam with the location of the view of the imaging device on the surface thereby enabling the imaging device to detect inconsistencies at the surface of the assembly being inspected.

14. The method set forth in claim 13, wherein the step of providing a galvanometer system is further defined by providing a galvanometer system including first scanning mirrors for redirecting the energy beam from the energy source, and including second scanning mirrors for redirecting the view of the imaging device in a synchronized manner across the surface being inspected.

15. The method set forth in claim 13, further including the step of sequentially moving a location of the energy beam upon the surface being inspected followed by synchronized movement of the view of the imaging device along the surface following increase in energy by the energy beam.

* * * * *